(12) United States Patent
Matsumoto

(10) Patent No.: US 10,923,333 B2
(45) Date of Patent: Feb. 16, 2021

(54) SUBSTRATE PROCESSING APPARATUS AND SUBSTRATE PROCESSING CONTROL METHOD

(71) Applicant: TOKYO ELECTRON LIMITED, Tokyo (JP)

(72) Inventor: Kenji Matsumoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/523,034

(22) Filed: Jul. 26, 2019

(65) Prior Publication Data

US 2020/0035466 A1    Jan. 30, 2020

(30) Foreign Application Priority Data

Jul. 27, 2018 (JP) .............................. JP2018-141439

(51) Int. Cl.
| | |
|---|---|
| *H01L 21/683* | (2006.01) |
| *H01L 21/687* | (2006.01) |
| *H01L 21/3065* | (2006.01) |
| *H01J 37/32* | (2006.01) |
| *H01L 21/67* | (2006.01) |

(52) U.S. Cl.
CPC .. *H01J 37/32642* (2013.01); *H01J 37/32724* (2013.01); *H01L 21/67069* (2013.01); *H01L 21/6833* (2013.01); *H01J 2237/20235* (2013.01); *H01J 2237/24578* (2013.01); *H01J 2237/334* (2013.01)

(58) Field of Classification Search
CPC ........... H01J 37/32348; H01J 37/32449; H01J 37/21; H01J 37/32467; H01J 37/32155; H01J 37/32091; H01J 37/32642; H01J 37/32165
See application file for complete search history.

(56) References Cited

U.S. PATENT DOCUMENTS

| | | | |
|---|---|---|---|
| 9,281,252 B1 * | 3/2016 | Wurfel ..................... | H01L 22/20 |
| 2010/0203736 A1 * | 8/2010 | Ichino ............... | H01J 37/32091 |
| | | | 438/710 |
| 2012/0180475 A1 * | 7/2012 | Shimizu .................. | F03G 7/005 |
| | | | 60/530 |
| 2018/0251893 A1 * | 9/2018 | Hohn .................. | C23C 16/4581 |

FOREIGN PATENT DOCUMENTS

JP          2008-244274 A       10/2008

* cited by examiner

*Primary Examiner* — Brian Turner
(74) *Attorney, Agent, or Firm* — Rothwell, Figg, Ernst & Manbeck, P.C

(57) ABSTRACT

A substrate processing apparatus includes a first mounting unit, a second mounting unit and an adjusting unit. The first mounting unit is configured to mount thereon a target substrate to be processed that is a plasma processing target. The second mounting unit is disposed to surround the first mounting unit to mount thereon a focus ring. The adjusting unit is configured to adjust a height of a peripheral portion of the target substrate with respect to a height of a central portion of the target substrate in response to consumption of the focus ring.

7 Claims, 13 Drawing Sheets

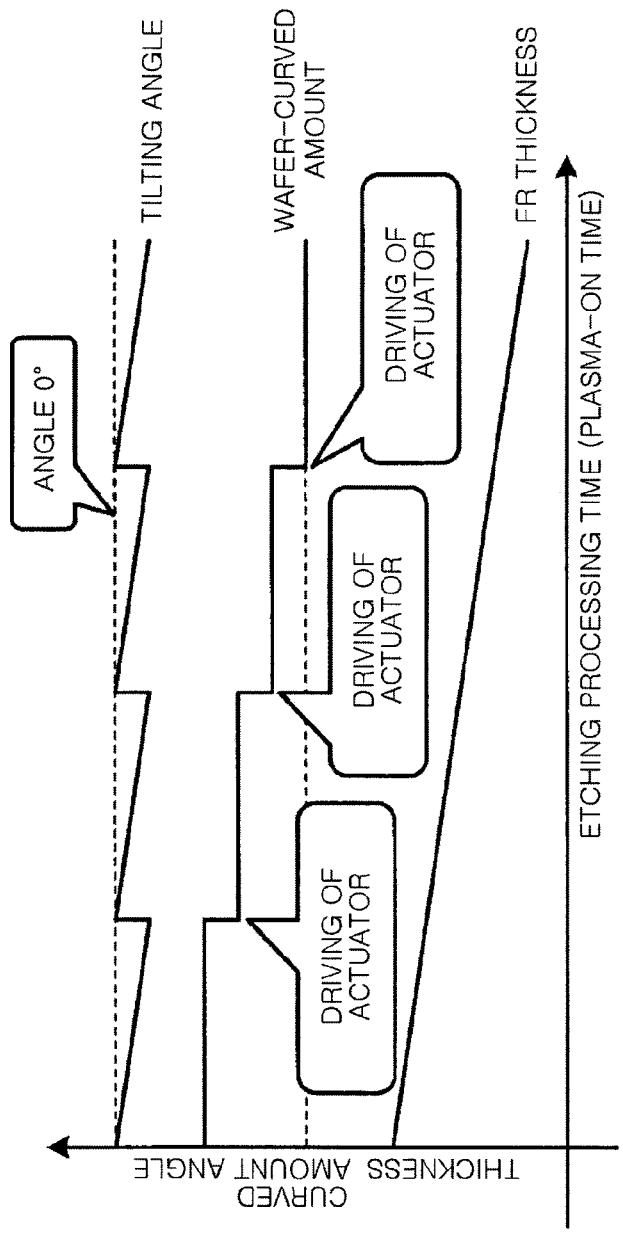

SUBSTRATE PROCESSING APPARATUS AND SUBSTRATE PROCESSING CONTROL METHOD

CROSS-REFERENCE TO RELATED APPLICATIONS

This application claims priority to Japanese Patent Application No. 2018-141439, filed on Jul. 27, 2018, the entire contents of which are incorporated herein by reference.

TECHNICAL FIELD

The present disclosure relates to a substrate processing apparatus and a substrate processing control method.

BACKGROUND

Japanese Patent Application Publication No. 2008-244274 discloses a technique for raising a focus ring disposed to surround an outer peripheral portion of a semiconductor wafer in response to a consumption of the focus ring.

SUMMARY

The present disclosure provides a technique capable of extending a replacement cycle of a focus ring with a simple configuration.

In accordance with an embodiment of the present disclosure, there is provided a substrate processing apparatus including: a first mounting unit configured to mount thereon a target substrate to be processed that is a plasma processing target; a second mounting unit disposed to surround the first mounting unit and configured to mount thereon a focus ring; and an adjusting unit configured to adjust a height of a peripheral portion of the target substrate with respect to a height of a central portion of the target substrate in response to consumption of the focus ring.

BRIEF DESCRIPTION OF THE DRAWINGS

The objects and features of the present disclosure will become apparent from the following description of embodiments, given in conjunction with the accompanying drawings, in which:

FIG. 13 shows a flow of an etching control method according to the second embodiment;

DETAILED DESCRIPTION

Hereinafter, embodiments of a substrate processing apparatus and a substrate processing control method of the present disclosure will be described in detail with reference to the accompanying drawings. In the present disclosure, an etching apparatus and an etching control method will be described in detail as specific examples of the substrate processing apparatus and the substrate processing control method. However, the following embodiments are not intended to limit the substrate processing apparatus and the substrate processing control method of the present disclosure.

In an etching apparatus for performing plasma etching on a target substrate to be processed such as a semiconductor wafer (hereinafter, referred to as "wafer") or the like, a focus ring is disposed to surround an outer peripheral portion of the wafer to improve plasma uniformity. The focus ring is consumed during the plasma processing, and thus is treated as a consumable part and replaceable part.

However, the focus ring is expensive, and the cost of consumables (COC) thereof becomes high as the lifespan or the replacement cycle thereof is shortened. When a wet cleaning of the etching apparatus is performed due to the replacement of the focus ring, a wet cleaning cycle (mean time between wet cleaning (MTBWC)) is shortened, which results in a decrease in the operation rate of the etching apparatus. Therefore, extending the replacement cycle of the focus ring with a simple configuration is desired.

First Embodiment

<Configuration of Apparatus>

Figure 1:
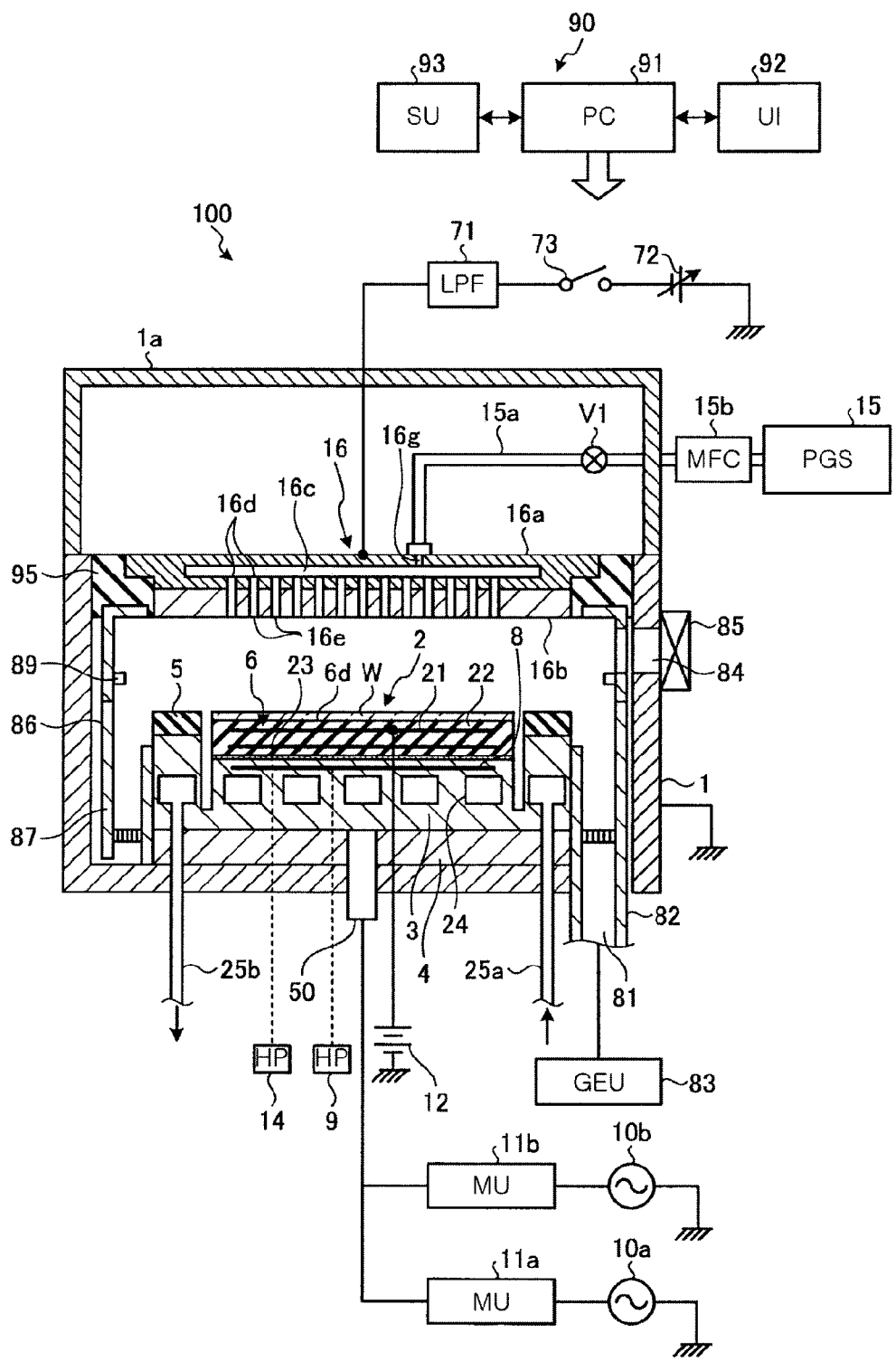
FIG. 1 is a cross-sectional view showing an example of a schematic configuration of an etching apparatus according to a first embodiment.

First, an example of the etching apparatus will be described. The etching apparatus performs plasma processing on a target substrate to be processed. In the present embodiment, a case where a wafer is used as the target substrate will be described as an example. FIG. 1 is a cross-sectional view showing an example of a schematic configuration of an etching apparatus according to a first embodiment. An etching apparatus 100 includes an airtight processing chamber 1 that is electrically grounded. The processing chamber 1 is formed in a cylindrical shape and made of, e.g., aluminum or the like. The processing chamber defines a processing space where plasma is formed. A mounting table 2 for horizontally supporting a wafer W that is the target substrate is accommodated in the processing chamber 1. In the present embodiment, the mounting table 2 includes a base 3 and an electrostatic chuck 6.

The base 3 is formed in a substantially cylindrical shape and made of a conductive metal, e.g., aluminum or the like. The base 3 serves as a lower electrode. The base 3 is supported by a support 4 that is an insulator, and the support 4 is installed at a bottom portion of the processing chamber 1. The base 3 is fastened at a bottom side thereof to the support 4 by, e.g., screws. The electrostatic chuck 6 is disposed at a central portion of the mounting table 2 when viewed from the top, and is configured to electrostatically attract and hold the wafer W.

The electrostatic chuck 6 has an electrode 21 and an insulator 22. The electrode 21 is disposed in the insulator 22, and a DC power supply 12 is connected to the electrode 21. The electrostatic chuck 6 electrostatically attracts and holds the wafer W by the Coulomb force generated by applying a DC voltage from the DC power supply 12 to the electrode 21. A heater 23 is installed at the electrostatic chuck 6. The heater 23 is connected to a heater power supply (HP) 14.

An annular focus ring 5 is disposed at an outer side of the electrostatic chuck 6. The focus ring 5 is made of, e.g., single crystalline silicon, and is supported by the base 3.

A power feed rod 50 is connected to the base 3. The power feed rod 50 is connected to a first RF power supply 10a through a first matching unit (MU) 11a and connected to a second RF power supply 10b through a second matching unit (MU) 11b. The first RF power supply 10a supplies a high frequency power for plasma generation, which has a predetermined frequency, to the base 3 of the mounting table 2. The second RF power supply 10b supplies a high frequency power for ion attraction (bias), which has a predetermined frequency lower than that of the first RF power supply 10a, to the base 3 of the mounting table 2.

A flow path 24 for a heat transfer medium is formed in the base 3. The flow path 24 is connected to an inlet line 25a and an outlet line 25b. By circulating a heat transfer medium, e.g., a coolant such as cooling water or the like, in the flow path 24, a temperature of the mounting table 2 can be controlled to a predetermined temperature. In addition, a gas supply line for supplying a cold heat transfer gas (backside gas) such as helium gas or the like to the backside of the wafer W may be provided to penetrate through the mounting table 2 or the like. The gas supply line is connected to a gas supply source. With this configuration, the wafer W electrostatically attracted and held by the electrostatic chuck 6 on the upper surface of the mounting table 2 can be controlled to a predetermined temperature.

A heater 8 is disposed in the base 3. The heater 8 is connected to a heater power supply (HP) 9.

A shower head 16 serving as an upper electrode is arranged above the mounting table 2 to be opposite to the mounting table 2 in parallel therewith. The shower head 16 and the mounting table 2 function as a pair of electrodes (the upper electrode and the lower electrode).

The shower head 16 is provided at a ceiling wall portion of the processing chamber 1. The shower head 16 is supported at an upper portion of the processing chamber 1 through an insulating member 95. The shower head 16 includes a main body 16a and a ceiling plate 16b serving as an electrode plate. The main body 16a is made of a conductive material, e.g., aluminum having an anodically oxidized surface. The main body 16a has a structure to detachably attach the ceiling plate 16b at a bottom portion of the main body 16a.

A gas diffusion space 16c is formed in the main body 16a. A plurality of gas holes 16d is formed in the bottom portion of the main body 16a to be positioned under the gas diffusion space 16c. Gas injection holes 16e are formed through the ceiling plate 16b in a thickness direction thereof. The gas injection holes 16e communicate with the gas holes 16d, respectively. With this configuration, the processing gas supplied to the gas diffusion space 16c is distributed in a shower-like manner into the processing chamber 1 through the gas holes 16d and the gas injection holes 16e.

A gas inlet port 16g for introducing the processing gas into the gas diffusion space 16c is formed in the main body 16a. One end of a gas supply line 15a is connected to the gas inlet port 16g and the other end of the gas supply line 15a is connected to a processing gas supply source (PGS) 15 for supplying a processing gas. A mass flow controller (MFC) 15b and an opening/closing valve V2 are disposed in the gas supply line 15a in that order from an upstream side. The processing gas for plasma etching is supplied from the processing gas supply source 15 to the gas diffusion space 16c through the gas supply line 15a and distributed in a shower-like manner into the processing chamber 1 through the gas holes 16d and the gas injection holes 16e.

A variable DC power supply 72 is electrically connected to the shower head 16 serving as the upper electrode through a low pass filter (LPF) 71. The power supply of the variable DC power supply 72 can be on-off controlled by an on/off switch 73. A current and a voltage of the variable DC power supply 72 and on/off operation of the on/off switch 73 are controlled by a control unit 90 to be described later. For example, when plasma is formed in the processing space by applying the high frequency powers from the first RF power supply 10a and the second RF power supply 10b to the mounting table 2, the on/off switch 73 is turned on by the control unit 90 and a predetermined DC voltage is applied to the shower head 16, if necessary.

A cylindrical ground conductor 1a extends upward from a sidewall of the processing chamber 1 to be located at a position higher than the shower head 16. The cylindrical ground conductor 1a has a ceiling wall at the top thereof.

A gas exhaust port 81 is formed at a bottom portion of the processing chamber 1. A gas exhaust unit (GEU) 83 is connected to the gas exhaust port 81 through a gas exhaust line 82. The gas exhaust unit 83 has a vacuum pump. By operating the vacuum pump, a pressure in the processing chamber 1 can be decreased to a predetermined vacuum level. A loading/unloading port 84 for the wafer W is provided at the sidewall of the processing chamber 1. A gate valve 85 for opening or closing the loading/unloading port 84 is provided at the loading/unloading port 84.

A deposition shield member 86 is provided to extend along an inner surface of the sidewall of the processing chamber 1. The deposition shield member 86 prevents etching by-products (deposits) from being attached to the processing chamber 1. A conductive port (GND block) 89 is provided to a portion of the deposition shield member 86 at a height position substantially same as the height of the wafer W. The conductive port 89 is connected to the ground such that a potential for the ground can be controlled. Due to the presence of the conductive port 89, abnormal discharge can be prevented. A deposition shield member 87 extending along the mounting table 2 is provided at a lower end portion of the deposition shield member 86. The deposition shield members 86 and 87 are detachably provided.

The operation of the etching apparatus 100 configured as described above is generally controlled by the control unit 90. The control unit 90 includes a process controller (PC) 91 having a CPU and configured to control the respective components of the etching apparatus 100, a user interface (UI) 92, and a storage unit (SU) 93.

The user interface 92 includes a keyboard through which a process manager inputs commands to operate the etching apparatus 100, a display for visualizing an operation status of the etching apparatus 100, and the like.

The storage unit 93 stores therein recipes including a control program (software), processing condition data and the like for realizing various processes performed by the etching apparatus 100 under the control of the process controller 91. Moreover, when a command is received from the user interface 92, a necessary recipe is retrieved from the storage unit 93 and executed by the process controller 91, so that a desired process is performed in the etching apparatus 100 under the control of the process controller 91. The recipes including the control program, the processing condition data and the like can be stored in a computer-readable storage medium, or can be transmitted, when needed, from another apparatus through, e.g., a dedicated line, and on-line. The computer-readable storage medium may be, e.g., a hard disk, a CD, a flexible disk, a semiconductor memory, or the like.

Figure 2:
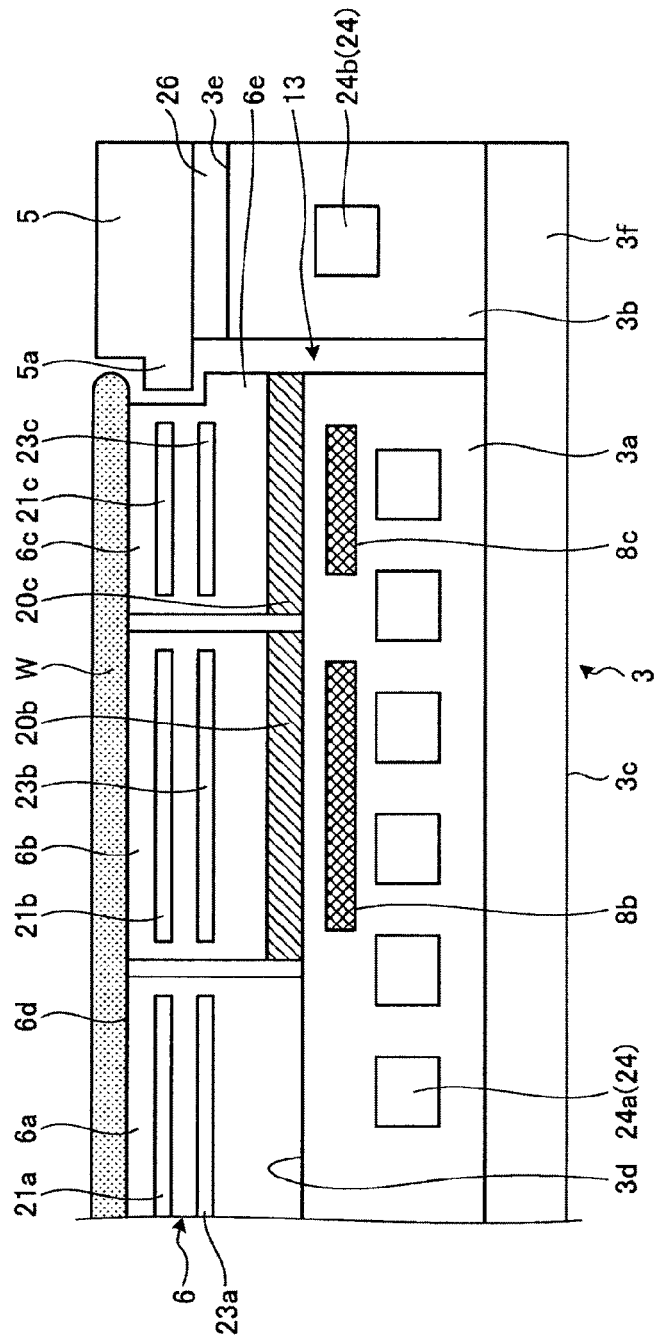
FIG. 2 is a cross-sectional view schematically showing an example of a main configuration of a mounting table according to the first embodiment.

Hereinafter, the main configuration of the mounting table 2 according to the first embodiment will be described with reference to FIG. 2. FIG. 2 is a cross-sectional view schematically showing an example of a main configuration of the mounting table according to the first embodiment.

The base 3 is formed in, e.g., a substantially cylindrical shape and has a bottom surface 3c and a surface side (upper surfaces 3d and 3e) opposite to the bottom surface 3c. An annular groove 13 is formed on the surface side of the base 3 and extends along the outer periphery of the wafer W mounted on the mounting table 2. In other words, the groove 13 is formed in an annular shape when viewed in a direction orthogonal to the surface of the base 3. The upper portion of the base 3 is divided by the groove 13 into a circular base central portion 3a disposed at a central portion when viewed from a direction orthogonal to the surface of the base 3 and an annular base peripheral portion 3b disposed at a peripheral portion when viewed from a direction orthogonal to the surface of the base 3. The base 3 may include a plurality of parts. For example, the base 3 may include a base central portion 3a, a base peripheral portion 3b, and a base portion 3f forming a lower portion of the base 3.

The base central portion 3a has a circular upper surface 3d for supporting the electrostatic chuck 6. The base peripheral portion 3b has an annular upper surface 3e for supporting the focus ring 5. The upper surface 3e serves as a mounting surface on which the focus ring 5 is mounted. The surface of the base 3 is divided by the groove 13 into the circular upper surface 3d and the annular upper surface 3e.

The heights of the upper surface 3d and the upper surface 3e are appropriately adjusted such that RF power or heat transfer to the wafer W become the same as RF power or heat transfer to the focus ring 5. In other words, although the heights of the upper surface 3d and the upper surface 3e are not the same in FIG. 2, the heights thereof may be the same.

The flow path 24 formed in the base 3 includes an inner flow path 24a disposed at the central portion of the base 3 and an outer flow path 24b disposed at the peripheral portion of the base 3. The inner flow path 24a is formed below the upper surface 3d of the base central portion 3a. The outer flow path 24b is formed below the upper surface 3e of the base peripheral portion 3b. In other words, the inner flow path 24a is disposed below the wafer W and serves to absorb heat of the wafer W, and the outer flow path 24b is disposed below the focus ring 5 and serves to absorb heat of the focus ring 5. The inner flow path 24a and the outer flow path 24b may be connected to different cooling mechanisms to allow coolants of different temperatures to flow therethrough.

Figure 3:
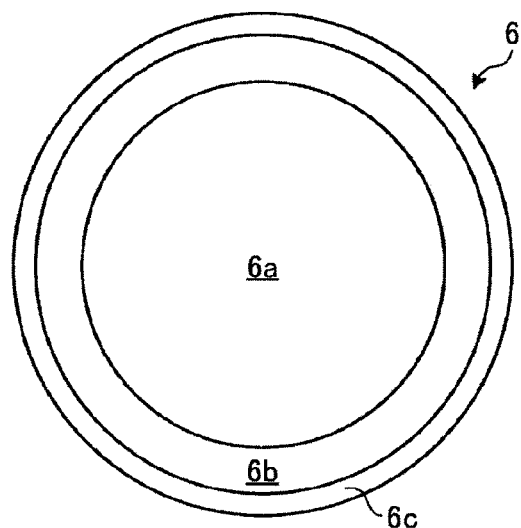
FIG. 3 shows an example of division of an electrostatic chuck according to the first embodiment.

The base central portion 3a of the base 3 supports the electrostatic chuck 6 on the upper surface 3d. In the present embodiment, the electrostatic chuck 6 corresponds to a first mounting unit. In the first embodiment, the electrostatic chuck is divided into a plurality of parts. FIG. 3 shows an example of division of the electrostatic chuck according to the first embodiment. The electrostatic chuck 6 is formed in a disk shape and concentrically divided into a plurality of regions. In the present embodiment, the electrostatic chuck 6 is divided into a circular electrostatic chuck 6a disposed at a central portion of the electrostatic chuck 6 and two annular electrostatic chucks 6b and 6c disposed at a peripheral portion of the electrostatic chuck 6, and the electrostatic chucks 6a, 6b and 6c are arranged in that order from the central side toward the outer peripheral side of the electrostatic chuck 6. Each of the electrode 21 and the heater 23 is divided into a plurality of parts to correspond to the respective regions of the electrostatic chuck 6. For example, the electrode 21 is divided into electrodes 21a, 21b, and 21c to correspond to the electrostatic chucks 6a, 6b, and 6c, and each of the electrodes 21a to 21c is connected to the DC power supply 12. Further, for example, the heater 23 is divided into heaters 23a, 23b, and 23c to correspond to the electrostatic chucks 6a, 6b, and 6c, and each of the heaters 23a to 23c is connected to the heater power supply 14.

A mounting surface 6d for mounting the wafer W is formed on the upper surfaces of the electrostatic chucks 6a to 6c. The electrostatic chucks 6a to 6c are brought into contact with the backside of the wafer W to support the disk-shaped wafer W. Further, the electrostatic chucks 6a to 6c electrostatically attract and hold the wafer W by applying a voltage from the DC power supply 12 to the electrodes 21a to 21c. A flange portion 6e projecting outward in a radial direction of the electrostatic chuck 6c is formed at a lower portion of the electrostatic chuck 6c. In other words, the electrostatic chuck 6c has different outer diameters depending on the position on the side surface.

The base peripheral portion 3b of the base 3 supports the focus ring 5 on the upper surface 3e. In the present embodiment, the base peripheral portion 3b corresponds to a second mounting unit. An adhesive layer 26 is disposed between the base peripheral portion 3b and the focus ring 5. The focus ring 5 that is an annular member is disposed on the base peripheral portion 3b. A protruding portion 5a projecting inward in a radial direction is formed on an inner side surface of the focus ring 5. In other words, the focus ring 5 has different inner diameters depending on positions on the inner side surface. For example, the inner diameter of the focus ring 5 where the protruding portion 5a is not formed is greater than the outer diameter of the wafer W and the outer diameter of the flange portion 6e. On the other hand, the inner diameter of the focus ring 5 where the protruding portion 5a is formed is smaller than the outer diameter of the flange portion 6e of the electrostatic chuck 6 and is greater than the outer diameter of the electrostatic chuck 6 where the flange portion 6e is not formed.

The focus ring 5 is disposed on the upper surface of the base peripheral portion 3b such that the protruding portion 5a is separated from the upper surface of the flange portion 6e of the electrostatic chuck 6 and from the side surface of the electrostatic chuck 6. In other words, a gap is formed between the bottom surface of the protruding portion 5a of the focus ring 5 and the upper surface of the flange portion 6e of the electrostatic chuck 6 and between the side surface of the protruding portion 5a of the focus ring 5 and the side surface of the electrostatic chuck 6 where the flange portion 6e is not formed. The protruding portion 5a of the focus ring is disposed above the groove 13. In other words, when viewed in a direction orthogonal to the mounting surface 6d, the protruding portion 5a is disposed at a position overlapping with the groove 13 and covers the groove 13. Accordingly, it is possible to prevent plasma from flowing into the groove 13.

A thickness variable layer that shrinks depending on a temperature to thereby change its thickness is disposed at least below a peripheral region among the divided regions of the electrostatic chuck 6. In the present embodiment, thickness variable layers 20b and 20c are disposed below the electrostatic chucks 6b and 6c. Each of the variable thickness layers 20b and 20c contain a shrinkable material, so that the thickness of each of the variable thickness layers 20b and 20c is irreversibly reduced when the shrinkable material shrinks at a predetermined high temperature. The shrinkable material may be, e.g., electron beam cross-linked polyolefin resin, electron beam cross-linked polyvinyl chloride resin, electron beam cross-linked polyvinylidene fluoride resin, electron beam cross-linked fluorine elastomer resin, and the like. The shrinkable materials have different shrinkage temperature ranges and different shrinkage rates.

An adhesive layer may be disposed between the electrostatic chucks 6a to 6c and the base central portion 3a, and the thickness variable layers 20b and 20c may serve as adhesive layers for bonding the electrostatic chuck 6 and the base central portion 3a. For example, each of the thickness variable layers 20b and 20c may have a structure of a sheet containing a shrinkable material in which an adhesive is coated on an upper surface and a bottom surface of the sheet, thereby bonding the electrostatic chuck 6 and the base central portion 3a. As an example of the adhesive, it is possible to use, e.g., a silicon-based adhesive, an epoxy-based adhesive, or an acrylic-based adhesive.

Figure 4:
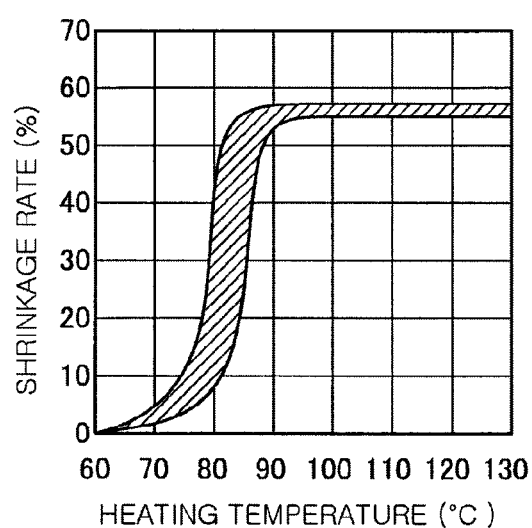
FIG. 4 shows an example of shrinkage of a shrinkable material depending on a temperature according to the first embodiment.

An example of the shrinkable material will be described. FIG. 4 shows an example of the shrinkage of the shrinkable material depending on a temperature according to the first embodiment. FIG. 4 shows a relationship between the temperature and the shrinkage rate in the case of using the electron beam cross-linked polyolefin resin as the shrinkable material. In FIG. 4, a temperature tolerance with respect to the shrinkage rate is about ±5° C. The electron beam cross-linked polyolefin resin shown in FIG. 4 starts shrinking at about 60° C. and shrinks by 55% at about 90° C. The electron beam cross-linked polyolefin resin shrinks depending on the temperature in a range from about 60° C. to about 90° C.

The shrinkage temperature range or the temperature-based shrinkage rate can be changed by adjusting types or amounts of shrinkable materials to be mixed. For example, a sheet that is mixed with multiple shrinking materials having different shrinking completion temperatures is disposed as each of the thickness variable layers 20b and 20c between the electrostatic chucks 6b and 6c and the base central portion 3a. For example, the shrinkage materials having the shrinkage completion temperatures of 90° C., 110° C., 130° C., and 150° C. are mixed in each of the sheets. Each of the shrinkage start temperatures of the shrinkable materials is set to be higher than the etching temperature. In this example, the etching temperature is set to be lower than or equal to 60° C. Alternatively, a plurality of sheets, each of which is made of shrinkable materials having different shrinkage completion temperatures, may be laminated. Further, when the shrinkage directions of the shrinkable materials are known and predetermined, each of the sheets is mixed or disposed such that the shrinkage directions are set to be the same as the direction in which the electrostatic chucks 6b and 6c are raised and lowered.

Specifically, in the case of the electron beam cross-linked polyolefin resin shown in FIG. 4 having a shrinkage completion temperature of 90° C. and a shrinkage rate of 55%, a film thickness of a resin sheet (polyolefin sheet) initially having a film thickness of 1 mm becomes 0.45 mm when the resin sheet is heated to 90° C. or higher. These characteristics will be utilized.

For example, for each of the thickness variable layers 20b and 20c, a sheet A formed by laminating the following sheets 1 to 4 having different shrinkage completion temperatures is used.

Figure 5:
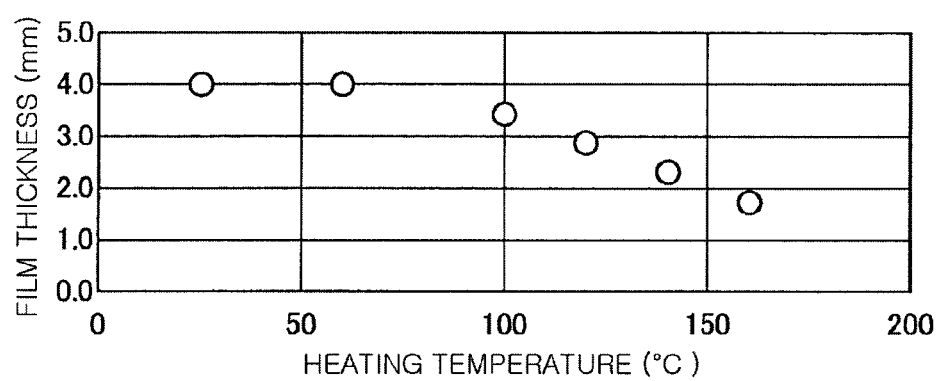
FIG. 5 shows an example of changes in a film thickness of a thickness variable layer with a temperature according to the first embodiment.

Sheet 1: Polyolefin resin sheet having a shrinkage completion temperature of 90° C., a shrinkage rate of 55%, and a film thickness of 1 mm Sheet 2: Polyolefin resin sheet having a shrinkage completion temperature of 110° C., a shrinkage rate of 55%, a film thickness of 1 mm Sheet 3: Polyolefin resin sheet having a shrinkage completion temperature of 130° C., a shrinkage rate of 55%, and a film thickness of 1 mm Sheet 4: Polyolefin resin sheet having a shrinkage completion temperature 150° C., a shrinkage rate of 55%, and a film thickness of 1 mm The sheet A has a film thickness of 4 mm at a room temperature. When the sheet A is heated to 100° C., the film thickness of the sheet A becomes 3.45 mm. When the sheet A is heated to 120° C., the film thickness of the sheet A becomes 2.90 mm. When the sheet A is heated to 140° C., the film thickness of the sheet A becomes 2.35 mm. When the sheet A is heated to 160° C., the film thickness of the sheet A becomes 1.80 mm. Therefore, as shown in FIG. 5, the thickness of the sheet A can be reduced by 550 μm at 20° C. intervals in a range beginning from 100° C. to 160° C.

Figure 6:
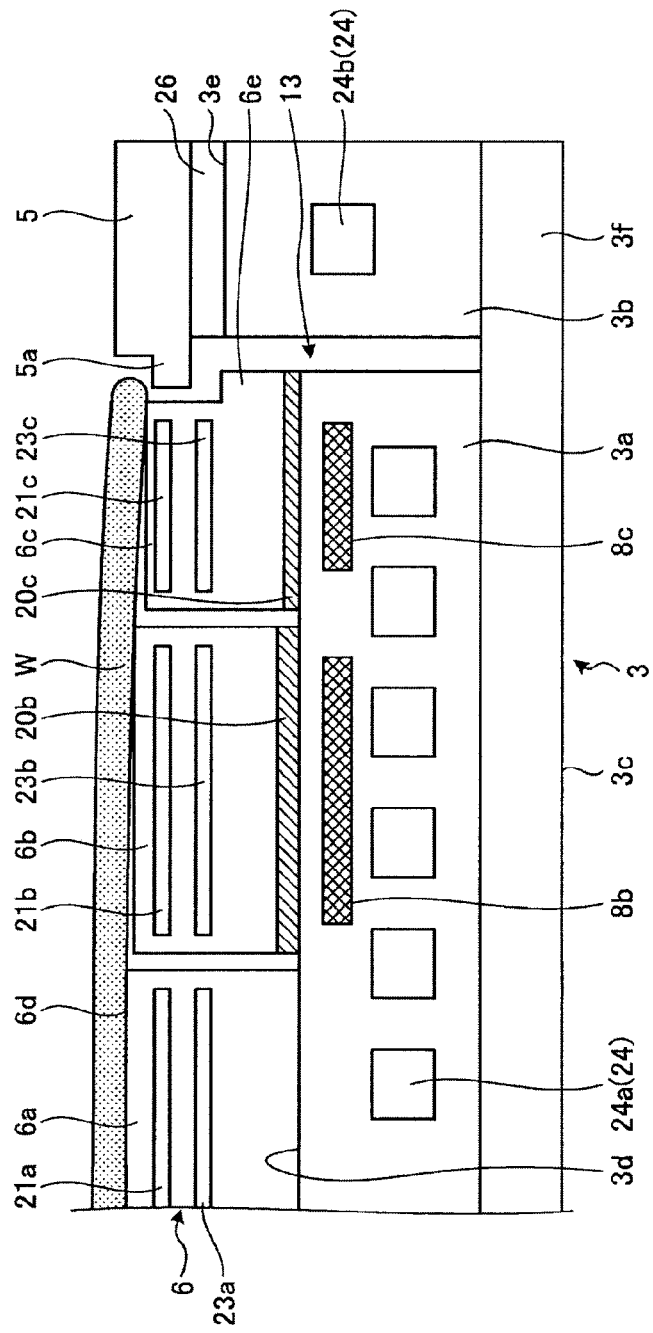
FIG. 6 is a cross-sectional view schematically showing an example of a state where the electrostatic chuck of the mounting table is lowered according to the first embodiment.

By mixing the shrinkable materials in the respective thickness variable layers 20b and 20c, the thickness variable layers 20b and 20c shrink depending on the temperature, thereby lowering the electrostatic chucks 6b and 6c. FIG. 6 is a cross-sectional view schematically showing an example of a state where the electrostatic chucks 6b and 6c of the mounting table are lowered according to the first embodiment. As the electrostatic chucks 6b and 6c are lowered, the peripheral portion of the wafer W is lowered compared to the central portion of the wafer W and is curved downward. As described above, the shrinkage temperature ranges or the temperature-based shrinkage rates of each of the thickness variable layers 20b and 20c can be changed by adjusting types or amounts of shrinkable materials to be mixed. In addition, for a material forming each of the thickness variable layers 20b and 20c, it is possible to use, e.g., thermosetting resin such as phenol resin, epoxy resin, melamine resin, urea resin, unsaturated polyester resin, diallyl phthalate resin, polyurethane resin, silicon resin, or the like.

Heaters 8b and 8c are arranged in the base central portion 3a at positions corresponding to the thickness variable layers 20b and 20c. For example, the heaters 8b and 8c are arranged above the flow path 24a in the base central portion 3a and below the thickness variable layers 20b and 20c. The heaters 8b and 8c generate heat by power supplied from the heater power supply 9 shown in FIG. 1. The control unit 90 is configured to control the power supplied from the heater power supply 9 to the heaters 8b and 8c to control the temperatures of the heaters 8b and 8c. By controlling the temperatures of the heaters 8b and 8c, the control unit 90 controls the shrinkage rates of the thickness variable layers 20*b* and 20*c*, thereby controlling the downward movement amount of the electrostatic chucks 6*b* and 6*c*, respectively.

Figure 7A:
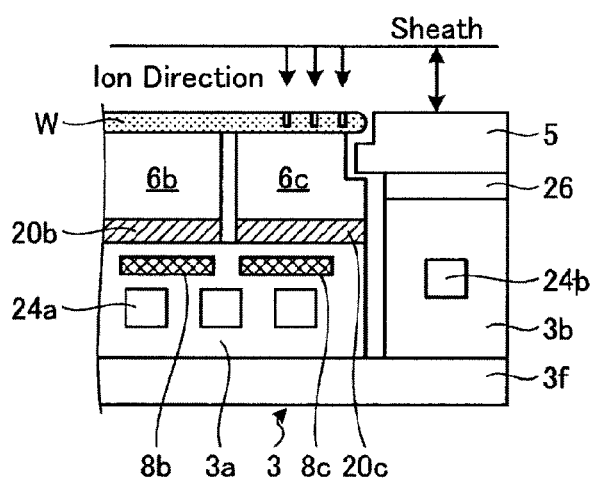
FIGS. 7A to 7C explain examples of operations and effects of the first embodiment.
Figure 7B:
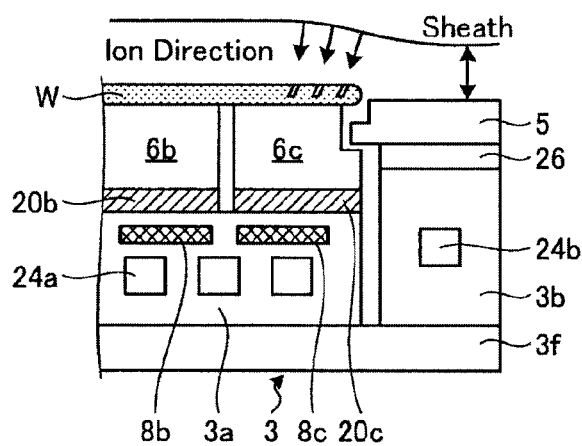
Figure 7C:
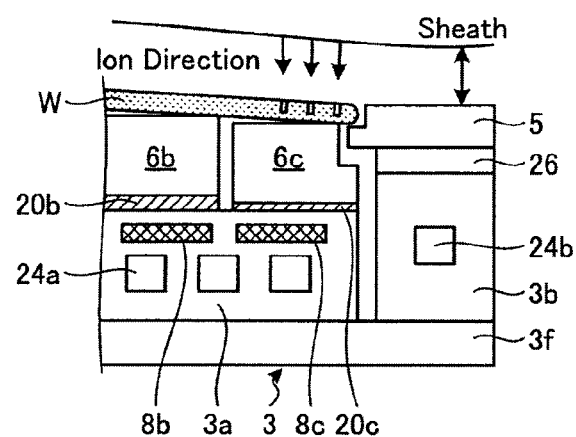

Next, the operations and the effects of the etching apparatus 100 according to the first embodiment will be described. FIGS. 7A to 7C explain examples of the operations and the effects of the first embodiment.

In the etching apparatus 100, when plasma processing such as plasma etching or the like is performed, the focus ring 5 is consumed. When the focus ring 5 is consumed, the thickness of the plasma sheath near the focus ring 5 is reduced. Therefore, the height of the plasma sheath with respect to the wafer W is changed, which also changes the processing characteristics. For example, in the case of using a new focus ring 5, the height of the plasma sheath above the upper surface of the focus ring 5 is substantially the same as the height of the plasma sheath above the upper surface of the wafer W and, thus, ions having positive charges are vertically incident on the wafer W and holes are etched normally, as shown in FIG. 7A.

However, when the focus ring 5 is consumed, the height of the plasma sheath above the focus ring 5 is reduced and, thus, the incident angle of ions having positive charges on the wafer W is changed, as shown in FIG. 7B. The change in the incident angle of the ions having positive charges leads to changes in etching characteristics. For example, shape abnormality such as tilting occurs in a hole(s) etched at the peripheral portion of the wafer W. The tilting is an abnormality in which a hole is etched obliquely.

Therefore, the control unit 90 reduces the thicknesses of the thickness variable layers 20*b* and 20*c* by controlling the temperatures of the heaters 8*b* and 8*c*, respectively, in response to the consumption of the focus ring 5 at predetermined timings, thereby lowering the electrostatic chucks 6*b* and 6*c*. Accordingly, the peripheral portion of the wafer W is curved downward. For example, in the present embodiment, the peripheral portion of the electrostatic chuck 6 is divided into the electrostatic chucks 6*b* and 6*c*. In that case, the control unit 90 lowers the upper surface of the electrostatic chuck 6*c* to be lower than the upper surface of the electrostatic chuck 6*b*, so that the upper surface of the electrostatic chuck is more lowered as it goes toward the peripheral portion of the wafer W. As a result, the peripheral portion of the wafer W is curved downward. Accordingly, even when the focus ring 5 is consumed, ions are vertically incident on the peripheral portion of the wafer W, so that normal etching of the holes can be performed.

For example, the shrinkage rate of each of the thickness variable layers 20*b* and 20*c*, at which the wafer W is curved so that the incident angle of ions on the peripheral portion of the wafer W can be within a given allowable range, are determined in advance depending on a processing time during which the plasma processing is performed. Then, for each processing time, the temperature of each of the heaters 8*b* and 8*c* at which the determined shrinkage rate is obtained is stored as control information on the thickness of each of the thickness variable layers 20*b* and 20*c* in the storage unit 93. At each timing when the plasma processing is performed for a predetermined period of time, the process controller 91 reads out the temperature of each of the heaters 8*b* and 8*c* corresponding to the processing time of the plasma processing from the control information stored in the storage unit 93. The process controller 91 controls the power supplied from the heater power supply 9 so that the temperature of each of the heaters 8*b* and 8*c* reaches the read-out temperature.

Alternatively, for example, the shrinkage rate of each of the thickness variable layers 20*b* and 20*c*, at which the wafer W is curved so that the incident angle of ions on the peripheral portion of the wafer W can be within a given allowable range, are determined in advance depending on a predetermined number of wafers W subjected to the plasma processing. Then, for each predetermined number of wafers W, the temperature of each of the heaters 8*b* and 8*c* at which the determined shrinkage rate is obtained is stored as control information on the thickness of each of the thickness variable layer 20*b* and 20*c* in the storage unit 93. At each timing when the plasma processing is performed for the predetermined number of wafers W, the process controller 91 reads out the temperature of each of the heater 8*b* and 8*c* corresponding to the number of processed wafers W from the control information stored in the storage unit 93. Further, the process controller 91 controls the power supplied from the heater power supply 9 so that the temperature of each of the heaters 8*b* and 8*c* reaches the read-out temperature.

Therefore, the thicknesses of the thickness variable layers 20*b* and 20*c* are reduced and the electrostatic chucks 6*b* and 6*c* are moved downwardly, which results in a downward curve of the peripheral portion of the wafer W. As a result, as shown in FIG. 7C, ions are vertically incident on the peripheral portion of the wafer W, so that normal (vertical) etching of the holes can be performed. With such configuration, the focus ring 5 can be used continuously, and the replacement cycle of the focus ring 5 can be extended.

As described above, the etching apparatus 100 can extend the replacement cycle of the focus ring 5 with a simple configuration that allows the peripheral portion of the wafer W to be curved by reducing the thicknesses of the thickness variable layers 20*b* and 20*c*.

The shape of the hole(s) of the wafer W etched by the etching apparatus 100 may be measured by an external measurement device. Such an external measurement device is well known in the art and, therefore, a detailed description is not necessary for the purpose of this disclosure. Then, the control unit 90 controls the temperatures of the heaters 8*b* and 8*c* to reduce the thicknesses of the thickness variable layers 20*b* and 20*c*, respectively, based on the measurement result of the measurement device, thereby lowering the electrostatic chucks 6*b* and 6*c*.

Figure 8:
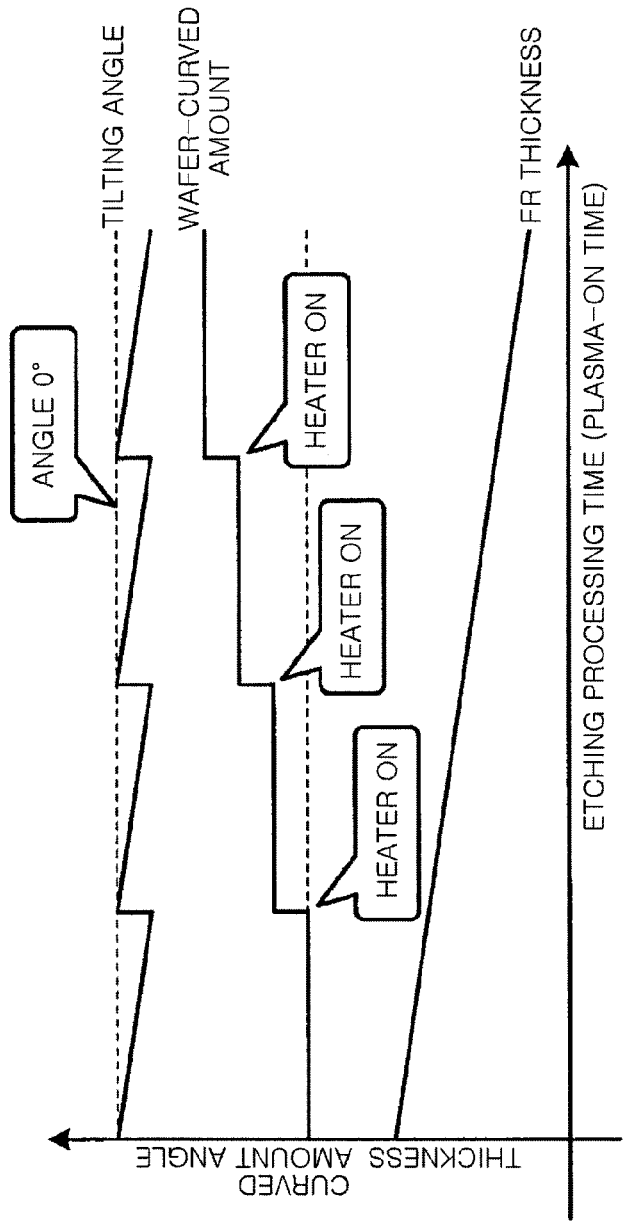
FIG. 8 shows a flow of an etching control method according to the first embodiment.

FIG. 8 shows a flow of an etching control method according to the first embodiment. The focus ring (FR) 5 is consumed as the processing time of plasma processing, e.g., plasma etching, elapses. Therefore, the height difference between the upper surface of the wafer W and the upper surface of the focus ring 5 is increased. Accordingly, the control unit 90 turns on the heaters 8*b* and 8*c* at predetermined timings to shrink the shrinkable materials of the thickness variable layers 20*b* and 20*c* in response to the consumption of the focus ring. Thus, the electrostatic chucks 6*b* and 6*c* are lowered to thereby make the peripheral portion of the wafer W curve downward. As a consequence, even when the focus ring 5 is consumed, the etching apparatus 100 can suppress the tilting angle of the holes in the peripheral portion of the wafer W within the allowable range. Therefore, the etching apparatus 100 can extend the replacement cycle of the focus ring 5.

Further, the film thicknesses of the thickness variable layers 20*b* and 20*c* may be measured by measuring the respective electrostatic capacitances between the electrodes 21*b* and 21*c* in the electrostatic chucks 6*b* and 6*c* and the heaters 8*b* and 8*c* in the base 3. Here, when the thickness of the thickness variable layer is denoted by "d" and the electrostatic capacitance between the electrode and the heater is denoted by "C", the characteristics that "C" is in inverse proportion to "d" can be utilized.

As described above, the etching apparatus 100 of the present embodiment includes the electrostatic chuck 6 and the base peripheral portion 3b. The electrostatic chuck 6 mounts thereon the wafer W that is a plasma etching target. The base peripheral portion 3b is disposed to surround the electrostatic chuck 6 and mounts thereon the focus ring 5. The etching apparatus 100 further includes an adjusting unit for adjusting the height of the peripheral portion of the wafer W with respect to that of the central portion of the wafer W in response to the consumption of the focus ring 5. Accordingly, the etching apparatus 100 can extend the replacement cycle of the focus ring 5 with a simple configuration.

In the etching apparatus 100, the electrostatic chuck 6 is formed in a disk shape and concentrically divided into a plurality of regions (electrostatic chucks 6a to 6c). The etching apparatus 100 includes, as the adjusting unit, the thickness variable layers 20b and 20c, the heaters 8b and 8c, and the control unit 90. The thickness variable layers 20b and 20c are disposed at least below the electrostatic chucks 6b and 6c corresponding to the peripheral portion of the electrostatic chuck 6. The thickness variable layers 20b and 20c shrink depending on the temperature to thereby change the thicknesses thereof. The heaters 8b and 8c are positioned to correspond to the thickness variable layers 20b and 20c, respectively. The control unit 90 controls the temperatures of the thickness variable layers 20b and 20c using the heaters 8b and 8c, respectively, in response to the consumption of the focus ring 5. Therefore, the etching apparatus 100 can control the temperatures of the heaters 8b and 8c to reduce the thicknesses of the variable thickness layers 20b and 20c. Accordingly, the peripheral portion of the wafer W can be curved, and the replacement cycle of the focus ring 5 can be extended.

Second Embodiment

Next, a second embodiment will be described. A schematic configuration of the etching apparatus 100 according to the second embodiment is the same as that of the etching apparatus 100 according to the first embodiment shown in FIG. 1. Therefore, the redundant description thereof will be omitted.

Figure 9:
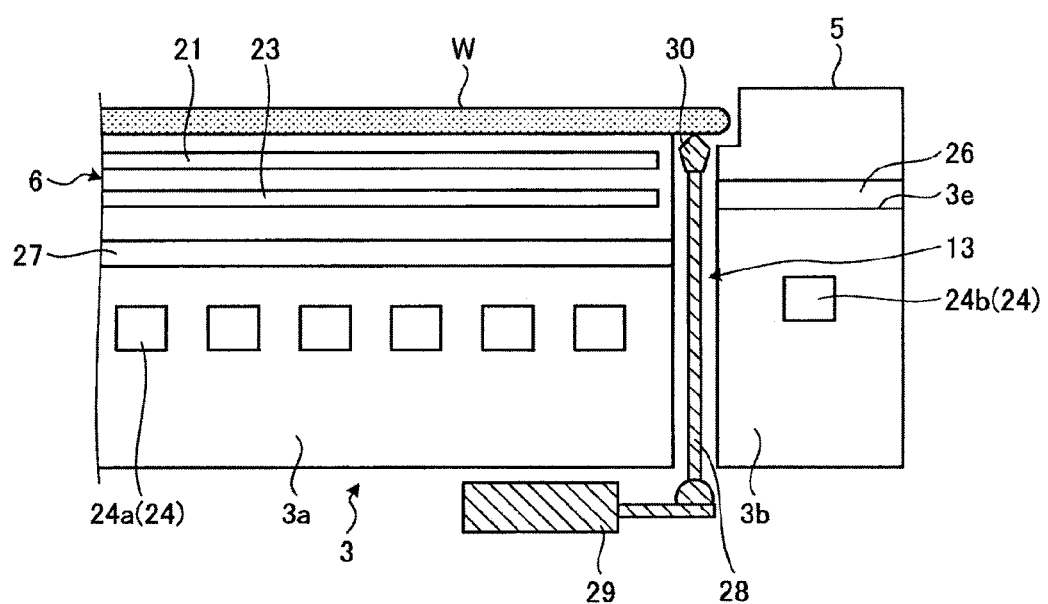
FIG. 9 is a cross-sectional view schematically showing an example of a main configuration of a mounting table according to a second embodiment.

FIG. 9 is a cross-sectional view schematically showing an example of a main configuration of the mounting table according to the second embodiment. The main configuration of the mounting table 2 according to the second embodiment is partially the same as that of the mounting table 2 according to the first embodiment shown in FIG. 2. Therefore, like reference numerals will be used for like parts, and the differences will be mainly described.

The base 3 according to the second embodiment is divided by the groove 13 into the base central portion 3a and the base peripheral portion 3b. The electrostatic chuck 6 is formed in a disk shape and disposed on the base central portion 3a through the adhesive layer 27. The electrostatic chuck 21 and the heater 23 are disposed in the electrostatic chuck 6.

Figure 10:
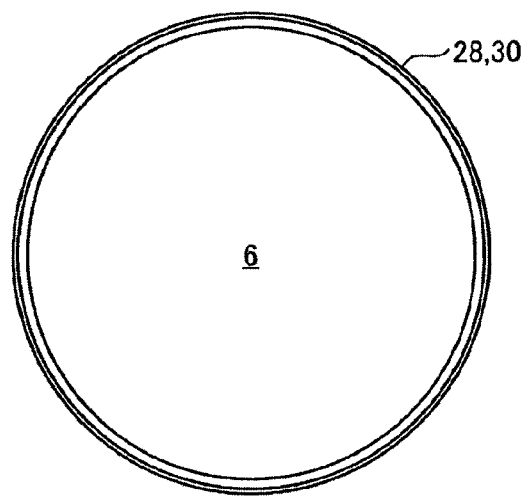
FIG. 10 shows an example of an arrangement of a support unit according to the second embodiment.

A support unit 28 for supporting the edge portion of the wafer W is disposed in the groove 13 to circumferentially extend along the outer periphery of the base central portion 3a. The support unit 28 has a protrusion 30 at an upper end thereof, and a tip end of the protrusion 30 is brought into contact with the edge portion of the wafer W. FIG. 10 shows an example of an arrangement of the support unit according to the second embodiment. In the present embodiment, one support unit 28 together with the protrusion 30 is disposed to circumferentially extend along the outer periphery of the base central portion 3a.

Referring back to FIG. 9, an elevation unit 29 for raising and lowering the support unit 28 having the protrusion 30 is provided at a lower portion of the support unit 28. The elevation unit 29 includes an actuator, and raises and lowers the support unit 28 by a driving force of the actuator.

Figure 11:
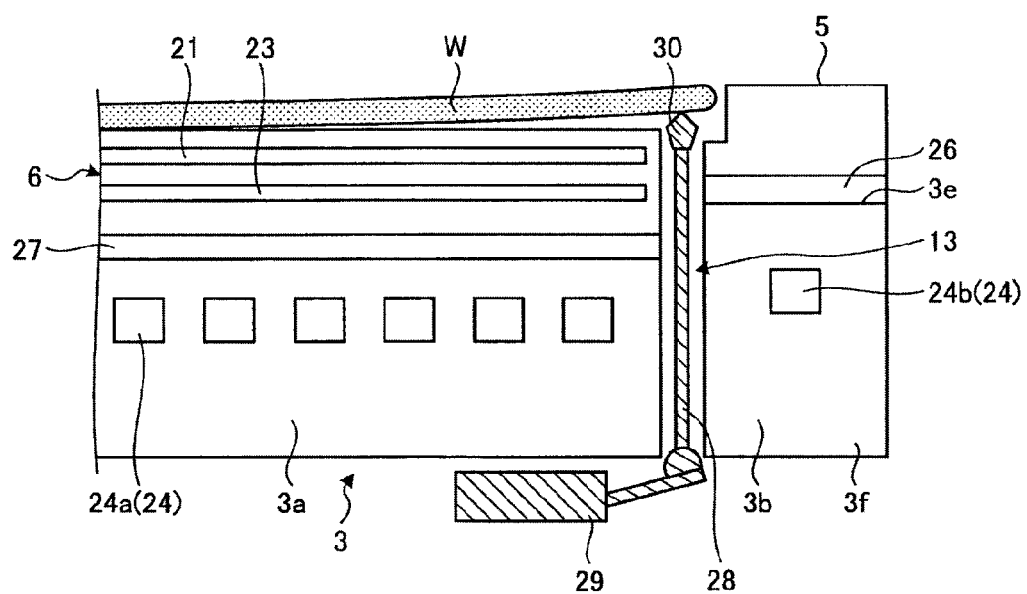
FIG. 11 is a cross-sectional view schematically showing an example of a state where the support unit of the mounting table is raised according to the second embodiment.

The control unit 90 is configured to control the elevation unit 29 to raise and lower the support unit 28 having the protrusion 30. When a new focus ring 5 is mounted on the base peripheral portion 3b, the control unit 90 controls the elevation unit 29 to raise the support unit 28 having the protrusion 30 to thereby raise the edge portion of the wafer W. As a result, the wafer W is curved upward. FIG. 11 is a cross-sectional view schematically showing an example of a state where the support unit of the mounting table is raised according to the second embodiment. Thereafter, the control unit 90 controls the elevation unit 29 to lower the support unit 28 having the protrusion 30 in response to the consumption of the focus ring 5.

Figure 12A:
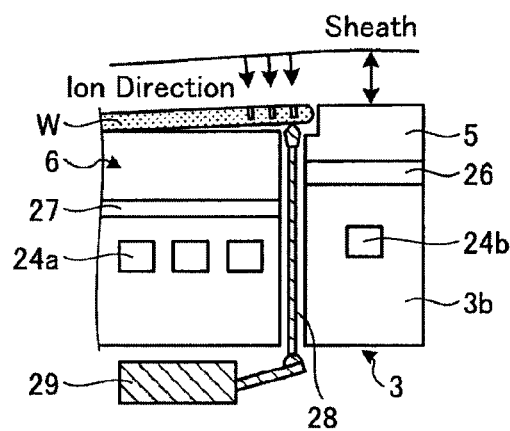
FIGS. 12A to 12C explain examples of operations and effects of the second embodiment.
Figure 12B:
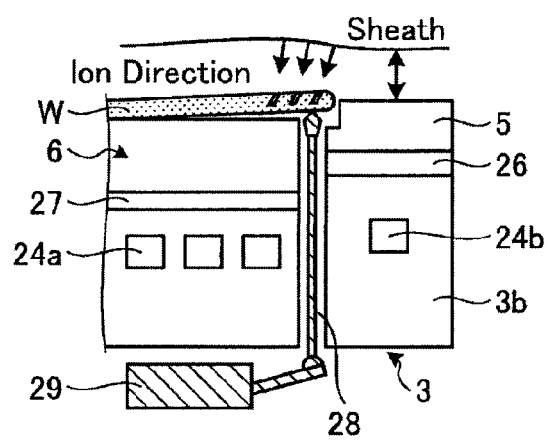
Figure 12C:
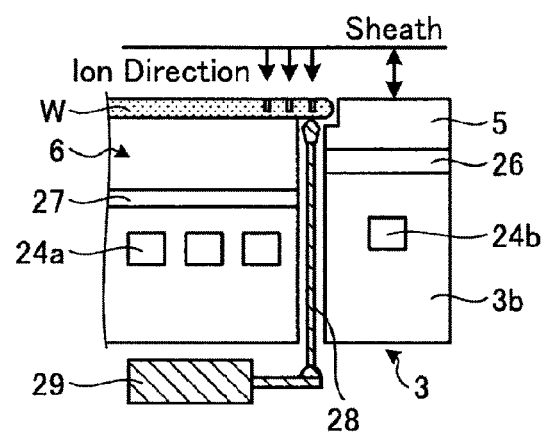

Next, the operations and the effects of the etching apparatus 100 according to the second embodiment will be described. FIGS. 12A to 12C explain examples of the operations and the effects of the second embodiment.

In the etching apparatus 100 according to the second embodiment, at least one of the heights of the base central portion 3a and the base peripheral portion 3b is adjusted in advance such that the incident angle of ions is tilted toward the center of the wafer W in a state where the new focus ring 5 is initially mounted on the base peripheral portion 3b.

Then, in the etching apparatus 100 according to the second embodiment, when the new focus ring 5 is mounted on the base peripheral portion 3b, the elevation unit 29 raises the support unit 28 having the protrusion 30. Accordingly, the edge portion of the wafer W is raised, and the wafer W is curved upward.

For example, an initial height of the support unit 28 having the protrusion 30, at which the wafer W is curved so that the incident angle of ions on the peripheral portion of the wafer W can be within a given allowable range when the new focus ring 5 is mounted, is determined in advance. For example, as shown in FIG. 12A, the initial height of the support unit 28 having the protrusion 30, at which the peripheral portion of the wafer W is curved upward so that ions can be vertically incident on the peripheral portion of the wafer W, is determined in advance. Then, when the new focus ring 5 is mounted on the base peripheral portion 3b, the control unit 90 controls the elevation unit 29 to raise the support unit 28 having the protrusion 30 up to the initial height.

The etching apparatus 100 performs plasma processing such as plasma etching or the like. When the etching apparatus 100 performs the plasma processing, the focus ring is consumed. When the focus ring 5 is consumed, the thickness of the plasma sheath near the focus ring 5 is reduced. Therefore, the height of the plasma sheath with respect to the wafer W is changed, which also changes the processing characteristics. For example, as shown in FIG. 12B, the height of the plasma sheath above the upper surface of the focus ring 5 is decreased, so that the incident angle of ions on the wafer W is changed, which leads to the change in the etching characteristics.

Accordingly, in response to the consumption of the focus ring 5, the control unit 90 controls the elevation unit 29 at predetermined timings to lower the support unit 28 having the protrusion 30 from the initial height, thereby reducing the degree of upward curve of the peripheral portion of the wafer W. With such configuration, even when the incident angle of ions is changed, the ions are vertically incident on the peripheral portion of the wafer W, so that normal (vertical) etching of the holes can be performed.

For example, the height of the support unit 28 having the protrusion 30, at which the wafer W is curved so that the incident angle of ions on the peripheral portion of the wafer W can be within a given allowable range, is determined in advance depending on a processing time during which the plasma processing is performed. Then, for each processing time, the determined height of the support 28 having the protrusion 30 is stored as control information on the height of the support unit 28 having the protrusion 30 in the storage unit 93. At each timing when the plasma processing is performed for a predetermined period of time, the process controller 91 reads out the height of the support unit 28 having the protrusion 30 corresponding to the processing time of the plasma processing from the control information stored in the storage unit 93. The process controller 91 controls the elevation unit 29 such that the height of the support unit 28 having the protrusion 30 reaches the read-out height.

Alternatively, for example, the height of the support unit 28 having the protrusion 30, at which the wafer W is curved so that the incident angle of ions on the peripheral portion of the wafer W can be within a given allowable range, is determined in advance depending on a predetermined number of wafers W subjected to the plasma processing. Then, for each predetermined number of wafers W, the determined height of the support unit 28 having the protrusion 30 is stored as control information on the height of the support unit 28 having the protrusion 30 in the storage unit 93. At each timing when the plasma processing is performed for the predetermined number of wafer W, the process controller 91 reads out the height of the support unit 28 having the protrusion 30 corresponding to the number of processed wafers W from the control information stored in the storage unit 93. Further, the process controller 91 controls the elevation unit 29 such that the height of the support unit 28 having the protrusion 30 reaches the read-out height.

Therefore, as shown in FIG. 12C, the ions are vertically incident on the peripheral portion of the wafer W, and the holes are normally (vertically) etched. With such configuration, the focus ring 5 can be used continuously, and the replacement cycle of the focus ring 5 can be extended.

As described above, the etching apparatus 100 can extend the replacement cycle of the focus ring 5 with a simple configuration that allows the peripheral portion of the wafer W to be curved by controlling the height of the support unit 28 having the protrusion 30 by the elevation unit 29 to raise and lower the edge portion of the wafer. W. The shape of the hole(s) of the wafer W etched by the etching apparatus 100 may be measured by an external measuring device. Such an external measuring device is well known in the art and, therefore, a detailed description is not necessary for the purpose of this disclosure. The control unit 90 controls the height of the support unit 28 having the protrusion 30 by the elevation unit 29 to raise and lower the edge portion of the wafer W based on the measurement result of the measurement device.

FIG. 13 shows a flow of an etching control method according to the second embodiment. In the etching apparatus 100, when the focus ring 5 is newly mounted on the base peripheral portion 3b, the elevation unit 29 raises the support unit 28 having the protrusion 30 to raise the edge portion of the wafer W, thereby making the wafer W curve upward. Then, the etching apparatus 100 performs plasma processing such as plasma etching or the like. The focus ring (FR) 5 is consumed as the processing time of plasma processing, e.g., plasma etching, elapses. Thus, the height difference between the upper surface of the wafer W and the upper surface of the focus ring 5 is increased. Here, the control unit 90 controls the elevation unit 29 at predetermined timings to lower the support unit 28 having the protrusion 30 from the initial height of the support unit 28 having the protrusion 30, thereby reducing the degree of upward curve of the peripheral portion of the wafer W. Accordingly, even when the focus ring 5 is consumed, the etching apparatus 100 can suppress (adjust) the tilting angle of the holes in the peripheral portion of the wafer W within the allowable range. Further, the etching apparatus 1 can extend the replacement cycle of the focus ring 5.

As described above, the etching apparatus 100 of the present embodiment includes, as the adjusting unit for adjusting the height of the peripheral portion of the wafer W with respect to that of the central portion of the wafer W in response to the consumption of the focus ring 5, the support unit 28 having the protrusion 30, the elevation unit 29, and the control unit 90. The support unit 28 having the protrusion 30 is disposed to circumferentially extend along the outer periphery of the electrostatic chuck 6 to support the edge portion of the wafer W. The elevation unit 29 raises and lowers the support unit 28 having the protrusion 30. When the focus ring 5 is newly mounted on the base peripheral portion 3b, the control unit 90 controls the elevation unit 29 to raise the support unit 28 having the protrusion 30. Thereafter, the control unit 90 controls the elevation unit 29 to lower the support unit 28 having the protrusion 30 in response to the consumption of the focus ring 5. Accordingly, in the etching apparatus 100, the peripheral portion of the wafer W can be curved by raising and lowering the edge portion of the wafer W by controlling the elevation unit 29 that raises and lowers the support unit 28 having the protrusion 30. As a result, the replacement cycle of the focus ring 5 can be extended.

While certain embodiments have been described, these embodiments have been presented by way of example only, and are not intended to limit the scope of the present disclosures. Indeed, the embodiments described herein may be embodied in a variety of other forms. Furthermore, various omissions, substitutions and changes in the form of the embodiments described herein may be made departing from the spirit of the present disclosure.

For example, in the above-described embodiments, the case where the etching apparatus 100 is a capacitively coupled plasma processing apparatus has been described as an example. However, the present disclosure is not limited thereto. For example, the etching apparatus 100 may be any type of plasma processing apparatus such as an inductively coupled plasma processing apparatus, or a plasma processing apparatus for exciting a gas by surface waves such as microwaves.

Further, in the above-described embodiments, the plasma etching has been described as an example of the substrate processing. However, the present disclosure may be applied to a film formation using plasma, such as plasma CVD or PVD (sputter deposition) other than the plasma etching. In the case of performing the film formation, unlike the case of performing the plasma etching, the height of the focus ring is increased due to deposits formed on the focus ring as a film formation time or the number of formed films is increased. The present disclosure may be applied thereto. For example, in the case of performing a sputter deposition on a substrate having a pattern, if the incident angle of ions is not perpendicular to the substrate, the film is not formed on a dead zone of the pattern. Therefore, the film formation amount becomes uneven on the right and left side of the pattern, which leads to deterioration of a throwing power, i.e., conformal characteristics in the pattern. In that case, it is effective to appropriately substitute and apply the above-described embodiments.

Figure 14:
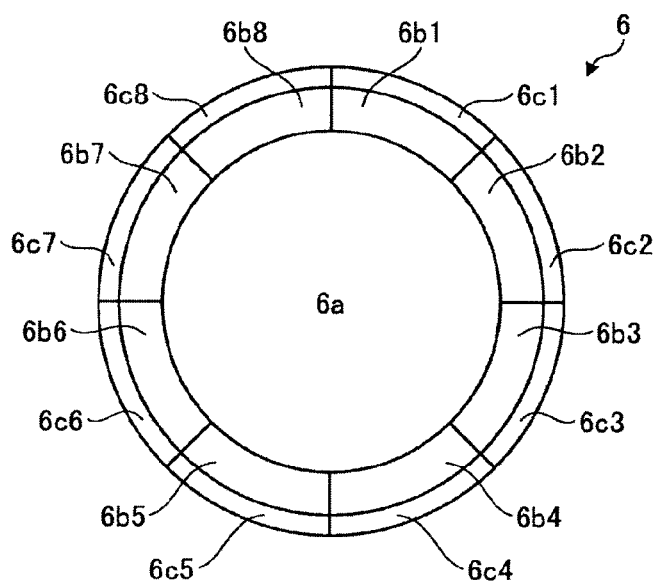
FIG. 14 shows an example of division of an electrostatic chuck according to another embodiment.

In the first embodiment described above, the case where the electrostatic chuck 6 is concentrically divided into a plurality of regions has been described as an example. However, the present disclosure is not limited thereto. For example, in the etching apparatus 100, at least the peripheral regions of the electrostatic chuck 6 may be further divided in a circumferential direction. Further, in the etching apparatus 100, the thickness variable layer and the heater may be disposed below each of the circumferentially divided regions. FIG. 14 shows an example of division of the electrostatic chuck according to another embodiment. In the example shown in FIG. 14, each of the electrostatic chucks 6b and 6c is divided into eight regions (electrostatic chucks 6b1 to 6b8 and 6c1 to 6c8) in the circumferential direction. The thickness variable layer and the heater are disposed below each of the electrostatic chucks 6b1 to 6b8 and 6c1 to 6c8. The etching apparatus 100 controls the temperature of the heater below each of the electrostatic chucks 6b1 to 6b8 and 6c1 to 6c8 to control the shrinkage rate of the thickness variable layer corresponding thereto, thereby controlling the downward movement of each of the electrostatic chucks 6b1 to 6b8 and 6c1 to 6c8. Therefore, the etching apparatus 100 can be configured such that the degree of downward curve is controlled at each circumferential position of the wafer W. Accordingly, even when the tilting angles onto the wafer W are different in the circumferential direction due to the difference in the consumption of the focus ring 5 in the circumferential direction, the tilting can be suppressed by controlling the degree of downward curve at each circumferential position of the wafer W.

Figure 15:
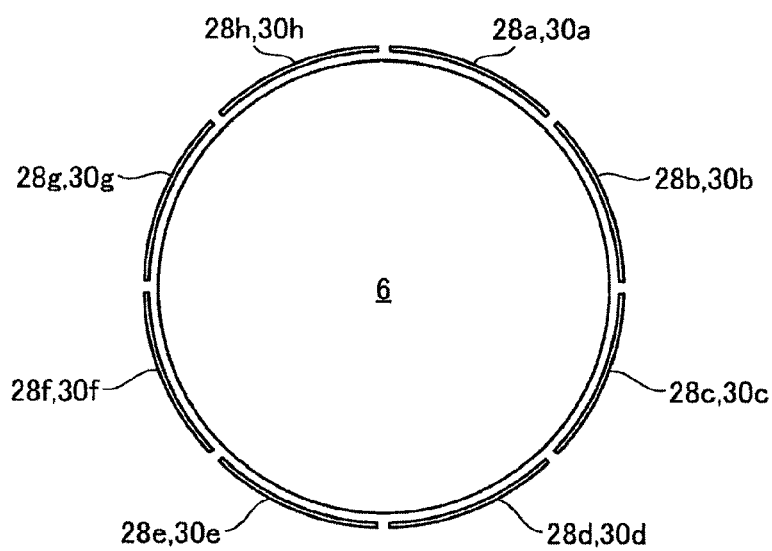
FIG. 15 shows an example of an arrangement of a support unit according to still another embodiment.

In the second embodiment described above, the case where one support unit 28 together with the protrusion 30 is disposed to circumferentially extend along the outer periphery of the base central portion 3a is described as an example. However, the present disclosure is limited thereto. For example, in the etching apparatus 100, the support unit 28 having the protrusion 30 may be divided into multiple parts. Further, in the etching apparatus 100, the elevation unit 29 may be provided for each of the support unit 28 having the protrusion 30. FIG. 15 shows an example of an arrangement of support units according to another embodiment. In the example shown in FIG. 15, the support unit 28 is divided into eight support units 28a to 28h and the protrusion 30 is divided into eight protrusions 30a to 30h in the circumferential direction. The elevation unit 29 is disposed below each of the support units 28a to 28h. The etching apparatus 100 controls the respective elevation units 29 for the support units 28a to 28h having the protrusions 30a to 30h to control the amount of vertical movement of the edge portion of the wafer W. Therefore, the etching apparatus 100 can be configured such that the degree of downward curve is controlled at each circumferential position of the wafer W. Accordingly, even when the tilting angles onto the wafer W are different in the circumferential direction due to the difference in the consumption of the focus ring 5 in the circumferential direction, the tilting can be suppressed by controlling the degree of downward curve at each circumferential position of the wafer W.

Further, the etching apparatus 100 according to the first embodiment may include the support unit 28 having the protrusion 30 and the elevation unit 29 described in the second embodiment. In this case, as in the second embodiment, the etching apparatus 100 initially raises the support unit 28 having the protrusion 30 to make the new focus ring 5 curve upward, and then lowers the support unit 28 having the protrusion 30 in response to the consumption of the focus ring 5 to make the focus ring 5 flat. Thereafter, as in the first embodiment, the etching apparatus 100 may lower the electrostatic chucks 6b and 6c to make the peripheral portion of the wafer W be curved downward.

Further, in the second embodiment described above, the case where the wafer W is curved upward by raising the support unit 28 having the protrusion 30 by mechanically driving the elevation unit 29 has been described as an example. However, the present disclosure is not limited thereto. For example, the etching apparatus 100 may be configured such that the wafer W is curved upward by controlling a pressure (atmospheric pressure) on the backside of the wafer W, controlling an electrostatic attraction voltage, or arranging the shrinkable material and the expandable material. The expandable material may be, e.g., expandable graphite (scale-like graphite intercalation compound), silicone rubber and the like.

Although a semiconductor wafer has been described as an example of a target substrate to be processed in the above-described embodiments, the semiconductor wafer may be silicon or may be a compound semiconductor such as GaAs, SiC, GaN, or the like. Further, a ceramic substrate and a glass substrate used for flat panel display (FPD) such as a liquid crystal display or the like may be employed as the target substrate without being limited to the semiconductor wafer.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A substrate processing apparatus comprising:
a first mounting unit configured to mount thereon a target substrate to be processed that is a plasma processing target;
a second mounting unit disposed to surround the first mounting unit and configured to mount thereon a focus ring; and
an adjusting unit configured to adjust a height of a peripheral portion of the target substrate with respect to a height of a central portion of the target substrate in response to consumption of the focus ring,
wherein the first mounting unit is formed in a disk shape and concentrically divided into a plurality of regions, and
the adjusting unit includes:
a thickness variable layer disposed at least below each of one or more regions, which correspond to a peripheral portion of the first mounting unit, among the plurality of regions, wherein the thickness variable layer has a thickness that varies due to shrinkage occurring depending on a temperature;

a heater disposed to correspond to the thickness variable layer; and a control unit configured to control the heater to heat the thickness variable layer in response to the consumption of the focus ring.

2. The substrate processing apparatus of claim 1, wherein at least one of the one or more regions corresponding to the peripheral portion of the first mounting unit among the plurality of regions is further divided into multiple regions in a circumferential direction, and the thickness variable layer and the heater are disposed below each of the circumferentially divided multiple regions.

3. The substrate processing apparatus of claim 2, wherein the adjusting unit includes:
- a support unit disposed to circumferentially extend along an outer periphery of the first mounting unit and configured to support an edge portion of the target substrate;
- an elevation unit configured to raise and lower the support unit; and
- a control unit configured to control the elevation unit to raise the support unit when the focus ring is newly mounted on the second mounting unit and control the elevation unit to lower the support unit in response to the consumption of the focus ring.

4. The substrate processing apparatus of claim 3, wherein the support unit is divided into multiple parts in a circumferential direction, and the elevation unit is provided for each of the multiple parts of the support unit.

5. The substrate processing apparatus of claim 1, wherein the adjusting unit includes:
- a support unit disposed to circumferentially extend along an outer periphery of the first mounting unit and configured to support an edge portion of the target substrate;
- an elevation unit configured to raise and lower the support unit; and
- a control unit configured to control the elevation unit to raise the support unit when the focus ring is newly mounted on the second mounting unit and control the elevation unit to lower the support unit in response to the consumption of the focus ring.

6. The substrate processing apparatus of claim 5, wherein the support unit is divided into multiple parts in a circumferential direction, and the elevation unit is provided for each of the multiple parts of the support unit.

7. A substrate processing control method comprising:
- mounting a target substrate to be processed as a plasma processing target on a first mounting unit, the first mounting unit being formed in a disk shape and concentrically divided into a plurality of regions;
- mounting a focus ring on a second mounting unit, wherein the second mounting unit is disposed to surround the first mounting unit; and
- adjusting a height of a peripheral portion of the target substrate with respect to a height of a central portion of the target substrate, by controlling a heater to heat a thickness variable layer, in response to consumption of the focus ring,
- wherein the thickness variable layer is disposed at least below each of one or more regions, which correspond to a peripheral portion of the first mounting unit, among the plurality of regions, wherein the thickness variable layer has a thickness that varies due to shrinkage occurring depending on a temperature, and the heater is disposed to correspond to the thickness variable layer.

* * * * *